United States Patent
Lee et al.

(10) Patent No.: US 12,520,580 B2
(45) Date of Patent: Jan. 6, 2026

(54) MACRO DEVICE-UNDER-TEST STRUCTURE FOR MEASURING CONTACT RESISTANCE OF SEMICONDUCTOR DEVICE

(71) Applicant: SAMSUNG ELECTRONICS CO., LTD., Suwon-si (KR)

(72) Inventors: Jaehong Lee, Latham, NY (US);
Myung Yang, Niskayuna, NY (US);
Kang-ill Seo, Springfield, VA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 183 days.

(21) Appl. No.: 18/239,586

(22) Filed: Aug. 29, 2023

(65) Prior Publication Data

US 2024/0387555 A1    Nov. 21, 2024

Related U.S. Application Data

(60) Provisional application No. 63/466,484, filed on May 15, 2023.

(51) Int. Cl.
*H10D 86/00* (2025.01)
*G01R 27/14* (2006.01)
(Continued)

(52) U.S. Cl.
CPC ............. *H10D 86/00* (2025.01); *G01R 27/14* (2013.01); *G01R 31/66* (2020.01); *H01L 23/5226* (2013.01); *H01L 23/528* (2013.01)

(58) Field of Classification Search
CPC ...... H10D 86/00; H10D 84/856; G01R 27/14; G01R 31/66; H01L 23/5226;
(Continued)

(56) References Cited

U.S. PATENT DOCUMENTS 9,053,992 B2    6/2015    Zhu
10,247,774 B2   4/2019    Chen et al.
(Continued)

OTHER PUBLICATIONS

Communication dated Oct. 1, 2024, issued by European Patent Center in European Patent Application No. 24169685.5.
(Continued)

*Primary Examiner* — Akm Zakaria
(74) *Attorney, Agent, or Firm* — Myers Bigel, P.A.

(57) ABSTRACT

Provided is a semiconductor device which includes: a $1^{st}$ source/drain region; a $2^{nd}$ source/drain region with a $2^{nd}$ contact plug thereon; a $3^{rd}$ source/drain region; a $2^{nd}$ metal line on the $2^{nd}$ contact plug with a $2^{nd}$ via therebetween; a $1^{st}$ additional metal line on the $2^{nd}$ contact plug with a $1^{st}$ additional via therebetween, wherein the $2^{nd}$ source/drain region is disposed between and connected to the $1^{st}$ source/drain region and the $3^{rd}$ source/drain region, and wherein the $2^{nd}$ metal line and the $1^{st}$ additional metal line are spaced apart from each other on the $2^{nd}$ contact plug by a $1^{st}$ predetermined distance in a $2^{nd}$ horizontal direction.

11 Claims, 9 Drawing Sheets

(51) Int. Cl.
  *G01R 31/66* (2020.01)
  *H01L 23/522* (2006.01)
  *H01L 23/528* (2006.01)

(58) Field of Classification Search
  CPC ....... H01L 23/528; H01L 22/14; H01L 22/20; H01L 22/34; H01L 23/485; H01L 23/4824
  See application file for complete search history.

(56) References Cited

U.S. PATENT DOCUMENTS

| | | | |
|---|---|---|---|
| 10,732,209 B2 | 8/2020 | Peng et al. | |
| 10,957,605 B2 | 3/2021 | Zhang et al. | |
| 2011/0049713 A1* | 3/2011 | Frohberg | H10D 84/038 438/675 |
| 2015/0249036 A1* | 9/2015 | Cai | H10D 84/83 257/382 |
| 2018/0301559 A1* | 10/2018 | Liaw | H01L 21/76831 |
| 2019/0013241 A1* | 1/2019 | Xie | H10D 84/0158 |
| 2020/0194567 A1* | 6/2020 | Hiblot | H10D 84/834 |
| 2020/0258778 A1* | 8/2020 | Lilak | H01L 21/76895 |
| 2022/0344263 A1 | 10/2022 | Peng et al. | |
| 2022/0367521 A1 | 11/2022 | Hong et al. | |
| 2022/0413038 A1 | 12/2022 | Kim et al. | |
| 2023/0094036 A1* | 3/2023 | Park | H10D 30/6219 257/347 |
| 2024/0332374 A1* | 10/2024 | Hung | H10D 62/83 |

OTHER PUBLICATIONS

European Extended Search Report issued Dec. 23, 2024 by the European Patent Office for EP Patent Application No. 24169685.5.

* cited by examiner

MACRO DEVICE-UNDER-TEST STRUCTURE FOR MEASURING CONTACT RESISTANCE OF SEMICONDUCTOR DEVICE

CROSS-REFERENCE TO THE RELATED APPLICATION

This application is based on and claims priority from U.S. Provisional Application No. 63/466,484 filed on May 15, 2023 in the U.S. Patent and Trademark Office, the disclosure of which is incorporated herein in its entirety by reference.

BACKGROUND

1. Field

Apparatuses and methods related to the disclosure relate to measuring a contact resistance in a semiconductor device.

2. Description of the Related Art

A three-dimensionally-stacked field-effect transistor (3DSFET) device including a lower transistor and an upper transistor stacked thereon has been introduced in response to an increased demand for integrated circuits having a high device density and performance. Each of the lower and upper transistors of the 3DSFET may be a fin field-effect transistor (FinFET), a nanosheet transistor or any other type of transistor. The FinFET has one or more horizontally arranged vertical fin structures as a channel structure of which at least three surfaces are surrounded by a gate structure, and the nanosheet transistor is characterized by one or more nanosheet channel layers vertically stacked on a substrate as a channel structure and a gate structure surrounding all four surfaces of each of the nanosheet channel layers. The nanosheet transistor is referred to as gate-all-around (GAA) transistor, or as a multi-bridge channel field-effect transistor (MBCFET).

Recently, the 3DSFET device has also employed a backside power distribution network (BSPDN) structure to address complexity of a back-end-of-line (BEOL) interconnect structures at a front side of the 3DSFET device. The BSPDN structure is provided to connect source/drain regions or frontside contact plugs of the 3DSFET device to a voltage source or another circuit element. The BSPDN structure is formed at a back side of the 3DSFET device, and may include a backside metal line such as a backside power rail, etc., a backside contact plug and a backside via which are buried in a substrate or a backside interlayer dielectric (ILD) structure.

In the 3DSFET device, a space for forming a contact structure such as a source/drain contact plug is very limited, whether it is a frontside contact structure or a backside contact structure. Thus, it is difficult to achieve 3DSFET device having a low-resistance contact structure. Accordingly, designing an improved device-under-test (DUT) structure for accurately measuring a contact resistance in a 3DSFET device is required at a development stage of the 3DSFET device so that the 3DSFET device can have an improved connection performance along with a high device density. Further, it is also required to separate out a contact resistance of a particular contact structure when a plurality of connection structures are included in a current path in the 3DSFET device. Herein, the term "contact structure" or "contact plug" may refer to that of a source/drain region formed thereon, and the term "a contact resistance" and "a value of a contact resistance" may be interchangeably used and may have the same meaning.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

The disclosure provides a 3DSFET device as an improved DUT structure for measuring a contact resistance in the 3DSFET device.

According to an embodiment, there is provided a semiconductor device which may include: a $1^{st}$ source/drain region; a $2^{nd}$ source/drain region with a $2^{nd}$ contact plug thereon; a $3^{rd}$ source/drain region; a $2^{nd}$ metal line on the $2^{nd}$ contact plug with a $2^{nd}$ via therebetween; a $1^{st}$ additional metal line on the $2^{nd}$ contact plug with a $1^{st}$ additional via therebetween, wherein the $2^{nd}$ source/drain region is disposed between and conneced to the $1^{st}$ source/drain region and the $3^{rd}$ source/drain region, and wherein the $2^{nd}$ metal line and the $1^{st}$ additional metal line are spaced apart from each other on the $2^{nd}$ contact plug by a $1^{st}$ predetermined distance in a $2^{nd}$ horizontal direction.

According to an embodiment, the semiconductor device may further include: a $1^{st}$ contact plug on the $1^{st}$ source/drain region, a $1^{st}$ via on the $1^{st}$ contact plug, and a $1^{st}$ metal line on the $1^{st}$ via; and a $3^{rd}$ contact plug on the $3^{rd}$ source/drain region, a $3^{rd}$ via on the $3^{rd}$ contact plug, and a $3^{rd}$ metal line on the $3^{rd}$ via.

According to an embodiment, the semiconductor device may further include: a $4^{th}$ source/drain region; a $5^{th}$ source/drain region with a $5^{th}$ contact plug thereon; a $6^{th}$ source/drain region; a $5^{th}$ metal line on the $5^{th}$ contact plug with a $5^{th}$ via therebetween; a $2^{nd}$ additional metal line on the $5^{th}$ contact plug with a $2^{nd}$ additional via therebetween, wherein the $5^{th}$ source/drain region is disposed between and conneced to the $4^{th}$ source/drain region and the $6^{th}$ source/drain region, and the $5^{th}$ metal line and the $2^{nd}$ additional metal line are spaced apart from each other by a $2^{nd}$ predetermined distance in the $2^{nd}$ horizontal direction.

According to an embodiment, the semiconductor device may further include: a $4^{th}$ contact plug on the $4^{th}$ source/drain region, a $4^{th}$ via on the $4^{th}$ contact plug, and a $4^{th}$ metal line on the $4^{th}$ via; and a $6^{th}$ contact plug on the $6^{th}$ source/drain region, a $6^{th}$ via on the $6^{th}$ contact plug, and a $6^{th}$ metal line on the $6^{th}$ via.

According to embodiments, the semiconductor device may further include at least one of a $1^{st}$ backside metal line connected to the $2^{nd}$ contact plug with a $1^{st}$ backside via therebetween, and a $2^{nd}$ backside metal line connected to the $5^{th}$ contact plug with a $2^{nd}$ backside via therebetween, wherein the $1^{st}$ backside via is vertically aligned with the $1^{st}$ additonal via, and the $2^{nd}$ backside via is vertically aligned with the $2^{nd}$ additional via.

According to an embodiment, there is provided a semiconductor device which may include: a $1^{st}$ source/drain region; a $2^{nd}$ source/drain region with a $2^{nd}$ contact plug theron; a $3^{rd}$ source/drain region; a $1^{st}$ backside metal line connected to the $2^{nd}$ contact plug at a $2^{nd}$ point with a $1^{st}$ backside via therebetween; and a $3^{rd}$ metal line on the $3^{rd}$ source/drain region with a $3^{rd}$ via therebetween, wherein a $2^{nd}$ point of the $2^{nd}$ contact plug to which the $1^{st}$ backside via is connected is spaced apart, by a $1^{st}$ predetermined distance in a $2^{nd}$ horizontal direction, from a $1^{st}$ point of the $2^{nd}$ contact plug which is aligned with the $1^{st}$ source/drain region and the $3^{rd}$ source/drain region in a $1^{st}$ horizontal direction which intersects the $2^{nd}$ horizontal direction.

According to an embodiment, there is provided a method of mesuring a contact resistance of a contact plug formed on a $2^{nd}$ source/drain region connected to a $1^{st}$ source/drain region and a $3^{rd}$ source/drain region in a semiconductor device. The method may include: connecting a $2^{nd}$ point of the contact plug to a backside metal line though a backside via; flowing a current from the backside metal line to the $1^{st}$ source/drain region through the $2^{nd}$ point of the contact plug and a $1^{st}$ point of the contact plug spaced apart from the $2^{nd}$ point by a predetermined distance in a $2^{nd}$ horizontal direction, the $1^{st}$ point being aligned with the $1^{st}$ source/drain region and the $3^{rd}$ source/drain region in a $1^{st}$ horizontal direction intersecting the $2^{nd}$ horizontal direction; measuring a $1^{st}$ voltage across the backside via and the contact plug, and calculating a $1^{st}$ combined contact resistance, which is a sum of a contact resistance of the backside via and a contact resistance of the contact plug, based on the $1^{st}$ voltage and the current; replacing the backside via with another backside via having a different width, and measuring a $2^{nd}$ voltage across the other backside via and the contact plug, and calculating the a $2^{nd}$ combined contact resistance, which is a sum of a contact resistance of the other backside via and a contact resistance of the contact plug, based on the $2^{nd}$ voltage and the current; repeating the measuring and the calculating at least one more time by replacing the other backside via with still another backside via having at least one more different width; and extrapolating the contact resistance of the contact plug based on a result of the repeated measuring and calculating. The extrapolating may be performed by assuming the width of the backside via is zero.

BRIEF DESCRIPTION OF DRAWINGS

Example embodiments of the inventive concept will be more clearly understood from the following detailed description taken in conjunction with the accompanying drawings in which.

DETAILED DESCRIPTION OF EXAMPLE EMBODIMENTS

Figure 1A:
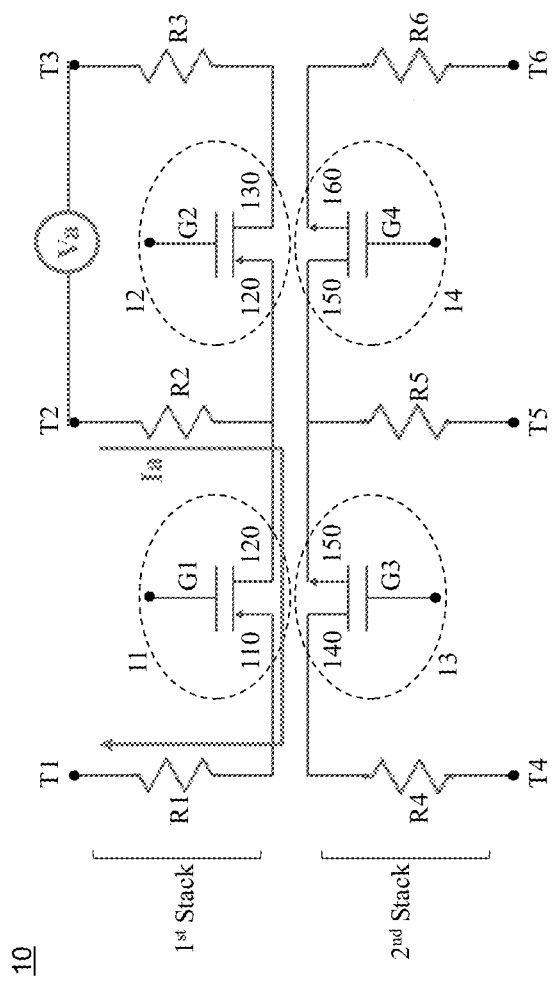
FIG. 1A illustrates a circuit schematic of a 3DSFET device configured to measure a contact resistance of a source/drain region included therein, according to an embodiment.

The embodiments of the disclosure described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof. For example, channel layers, sacrificial layers, and isolation layers described herein may take a different type or form as long as the disclosure can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "left," "right," "lower-left," "lower-right," "upper-left," "upper-right," "central," "middle," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, an element described as "below" or "beneath" another element would then be oriented "above" the other element. Thus, the term "below" can encompass both an orientation of above and below. The semiconductor device may be otherwise oriented (rotated 90 degrees or at other orientations) and the spatially relative descriptors used herein interpreted accordingly. As another example, when elements referred to as a "left" element and a "right" element" may be a "right" element and a "left" element when a device or structure including these elements are differently oriented. Thus, in the descriptions hereinbelow, the "left" element and the "right" element may also be referred to as a "$1^{st}$" element or a "$2^{nd}$" element, respectively, as long as their structural relationship is clearly understood in the context of the descriptions. Similarly, the terms a "lower" element and an "upper" element may be respectively referred to as a "$1^{st}$" element and a "$2^{nd}$" element with necessary descriptions to distinguish the two elements.

It will be understood that, although the terms "$1^{st}$," "$2^{nd}$," "$3^{rd}$," "$4^{th}$," "$5^{th}$," "$6^{th}$," etc. may be used herein to describe various elements, these elements should not be limited by these terms. These terms are only used to distinguish one element from another element. Thus, a $1^{st}$ element discussed below could be termed a $2^{nd}$ element without departing from the teachings of the disclosure. Further, for description consistency, a claim of the present application may recite or describe a $2^{nd}$ element which is described in an embodiment without describing therein a $1^{st}$ element which is also described in the embodiment when the $1^{st}$ element is not necessary to define the claim.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c. Herein, when a term "same" or "equal" is used to compare a dimension of two or more elements, the term may cover a "substantially same" or "substantially equal" dimension.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. Various regions illustrated in the figures are schematic in nature and their shapes are not intended to illustrate the actual shape of a region of a device and are not intended to limit the scope of the disclosure. Further, in the drawings, the sizes and relative sizes of layers and regions may be exaggerated for clarity.

For the sake of brevity, conventional elements, structures or layers of semiconductor devices including a nanosheet transistor or field-effect transistor and materials forming the same may or may not be described in detail herein. For example, a certain isolation layer or structure of a semiconductor device and materials forming the same may be omitted herein when this layer or structure is not related to the novel features of the embodiments. Also, descriptions of materials forming well-known structural elements of a semiconductor device may be omitted herein when those materials are not relevant to the novel features of the embodiments. For example, the disclosure omits descriptions of materials of a substrate (e.g., silicon, germanium, etc.), a source/drain region (e.g., silicon doped with p-type or n-type impurities), and a gate structure (e.g., copper (Cu), aluminum (Al), cobalt (Co), tungsten (W), titanium (Ti), tantalum (Ta) or their combination).

Figure 1B:
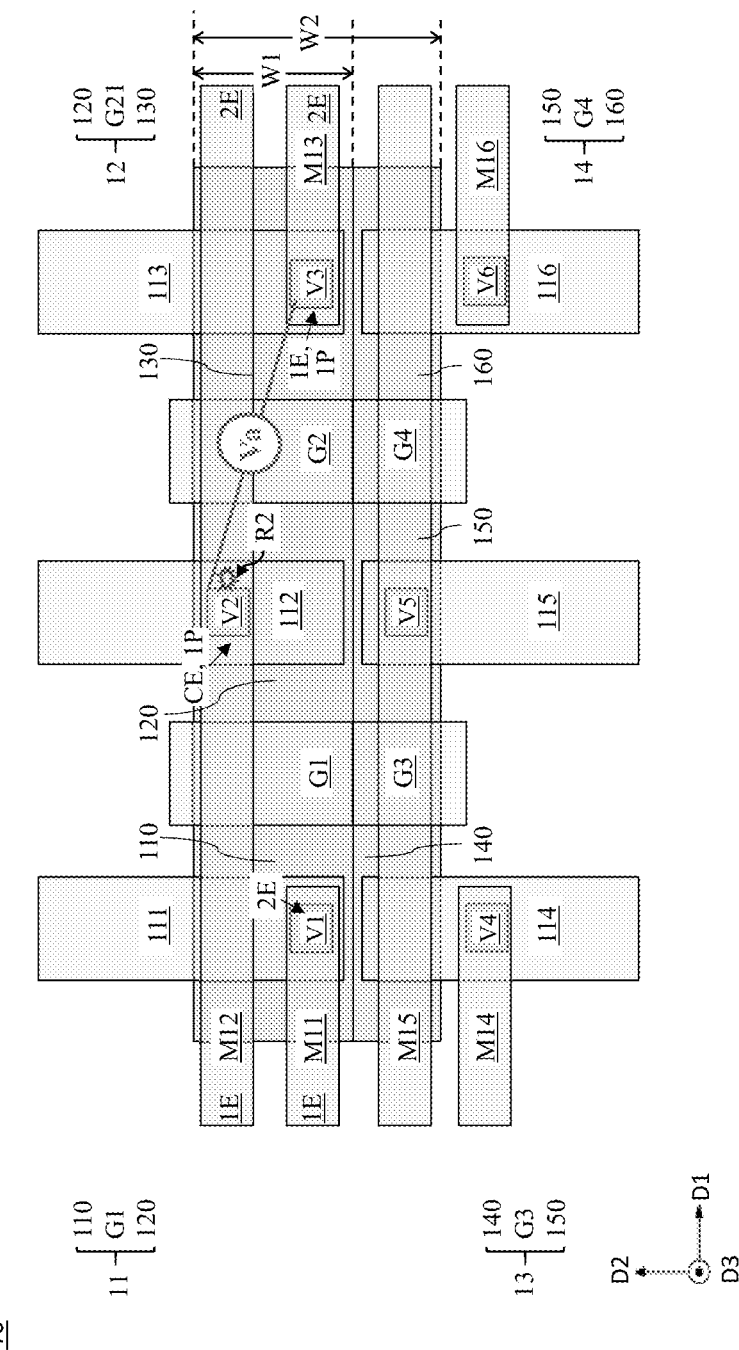
FIG. 1B illustrates a top plan view of the 3DSFET device of FIG. 1A, according to an embodiment, and FIG. 1C illustrate a perspective view of the 3DSFET device of FIG. 1A, according to an embodiment.
Figure 1C:
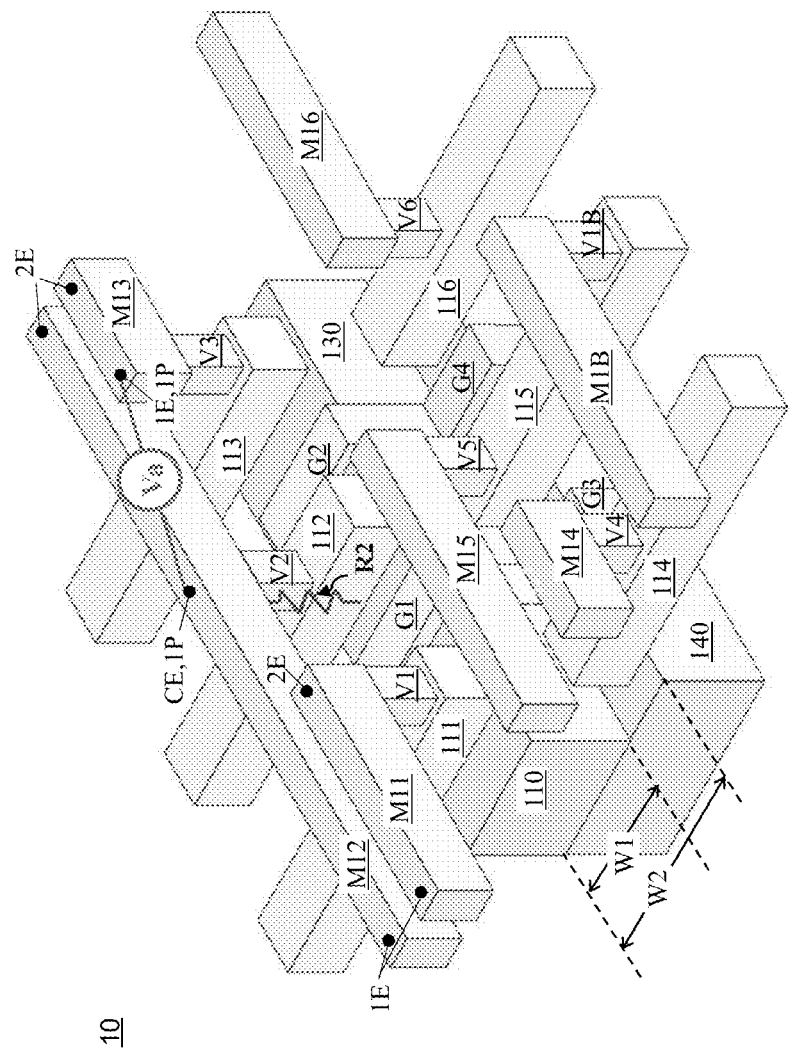

FIG. 1A illustrates a circuit schematic of a 3DSFET device configured to measure a contact resistance of a source/drain region included therein, according to an embodiment. FIG. 1B illustrates a top plan view of the 3DSFET device of FIG. 1A, according to an embodiment. FIG. 1C illustrate a perspective view of the 3DSFET device of FIG. 1A, according to an embodiment.

Referring to FIGS. 1A-1C, a 3DSFET device 10 may include a $1^{st}$ field-effect transistor 11 and a $2^{nd}$ field-effect transistor 12 at a $1^{st}$ stack, and a $3^{rd}$ field-effect transistors 13 and a $4^{th}$ field-effect transistor 14 at a $2^{nd}$ stack which may be formed below the $1^{st}$ stack in the 3DSFET device 10. The $1^{st}$ stack and the $2^{nd}$ stack may represent an upper stack and a lower stack, respectively. The $1^{st}$ field-effect transistor 11 and the $2^{nd}$ field-effect transistor 12 may each be a p-type metal-oxide-semiconductor field-effect transistor (PMOS), and the $3^{rd}$ field-effect transistor 13 and the $4^{th}$ field-effect transistor 14 may each be an n-type metal-oxide-semiconductor field-effect transistor (NMOS). However, the disclosure is not limited thereto. According to embodiments, the $1^{st}$ field-effect transistor 11 and the $2^{nd}$ field-effect transistor 12 may each be implemented by either of the PMOS and the NMOS, and also, the $3^{rd}$ field-effect transistor 13 and the $4^{th}$ field-effect transistor 14 may each also be implemented by either of the NMOS and the PMOS.

The $1^{st}$ field-effect transistor 11 may include a $1^{st}$ source/drain region 110 and a $2^{nd}$ source/drain region 120 connected to each other through a channel structure surrounded by a $1^{st}$ gate structure G1. The $2^{nd}$ field-effect transistor 12 may include the $2^{nd}$ source/drain region 120 and a $3^{rd}$ source/drain region 130 connected to each other through a channel structure surrounded by a $2^{nd}$ gate structure G2. The channel structures are not seen in the drawings as they are surrounded by the gate structures G1 and G2. The $2^{nd}$ source/drain region 120 is a common source/drain region shared by the $1^{st}$ field-effect transistor 11 and the $2^{nd}$ field-effect transistor 12 at the $1^{st}$ stack. Thus, the two transistors 11 and 12 at the $1^{st}$ stack of the 3DSFET device 10 may be disposed to be symmetric to each other in a $1^{st}$ direction D1, which is a channel-length direction, with respect to the $2^{nd}$ source/drain region 120.

Similarly, the $3^{rd}$ field-effect transistor 13 may include a $4^{th}$ source/drain region 140 and a $5^{th}$ source/drain region 150 connected to each other through a channel structure surrounded by a $3^{rd}$ gate structure G3. The $4^{th}$ field-effect transistor 14 may include the $5^{th}$ source/drain region 150 and a $6^{th}$ source/drain region 160 connected to each other through a channel structure (not shown) surrounded by a $4^{th}$ gate structure G4. The $5^{th}$ source/drain region 150 may be a common source/drain region shared by the $3^{rd}$ field-effect transistor 13 and the $4^{th}$ field-effect transistor 14 at the $2^{nd}$ stack. Thus, the two transistors 13 and 14 at the $2^{nd}$ stack of the 3DSFET device 10 may also be disposed to be symmetric to each other in the $1^{st}$ direction D1 with respect to the $5^{th}$ source/drain region 150.

The 3DSFET device 10 may be structured such that the $1^{st}$ to $3^{rd}$ source/drain regions 110-130 may have a width W1 which is smaller than a width W2 the $4^{th}$ to $6^{th}$ source/drain regions 140-160 respectively formed below the $1^{st}$ to $3^{rd}$ source/drain regions 110-130. Due to this width difference, the $4^{th}$ to $6^{th}$ source/drain regions 140-160 may not be entirely overlapped by the $1^{st}$ to $3^{rd}$ source/drain regions 110-130 so that contact plugs of the $4^{th}$ to $6^{th}$ source/drain regions 140-160, to be described below, can be formed on and connected to top surfaces of the $4^{th}$ to $6^{th}$ source/drain regions 140-160, respectively.

Referring to FIGS. 1B and 1C, $1^{st}$ to $6^{th}$ contact plugs 111-116 may be formed on the $1^{st}$ to $6^{th}$ source/drain regions 110-160 to connect the $1^{st}$ to $6^{th}$ source/drain regions 110-

160 to a voltage source or other circuit elements for internal routing in an integrated circuit including the 3DSFET device 10. The contact plugs 111-116 may be formed of a metal or metal compound such as tungsten (W), cobalt (Co), aluminum (Al), titanium (Ti), tantalum (Ta), molybdenum (Mo), ruthenium (Ru), copper (Cu), etc. Further, the contact plugs 111-116 may have a same dimension such as a height in a $3^{rd}$ direction D3.

$1^{st}$ to $6^{th}$ metal lines M11-M16 may be formed on the $1^{st}$ to $6^{th}$ contact plugs 111-116 with $1^{st}$ to $6^{th}$ vias V1-V6 therebetween. The $1^{st}$ to $6^{th}$ metal lines M11-M16 may be extended in the $1^{st}$ direction DI so that their ends 1E and 2E may not vertically overlap the $1^{st}$ to $6^{th}$ source/drain regions 110-160 at least to facilitate connection of these metal lines to circuits for measuring voltages and currents to calculate contact resistance values of the 3DSFET device 10 as will be described later.

The metal lines M11-M16 may be formed at a same level in the $3^{rd}$ direction D3 in a same metal layer, and may overlap at least partially the $1^{st}$ to $6^{th}$ source/drain regions 110-160, respectively, in a vertical direction. However, the disclosure is not limited thereto, and at least one of these metal lines M11-M16 may or may not vertically overlap a corresponding source/drain region. For example, FIGS. 1B and 1C show that the $4^{th}$ and $6^{th}$ metal lines M14 and M16 do not vertically overlap the $4^{th}$ and $6^{th}$ source/drain regions 140 and 160, respectively. When a metal line vertically overlaps a corresponding source/drain region, they may be aligned with each other in the $1^{st}$ direction D1. For example, the $2^{nd}$ metal line M12 at a point CE disposed between a $1^{st}$ end 1E and a $2^{nd}$ end 2D thereof and vertically aligned with a $1^{st}$ point IP of the $2^{nd}$ contact plug 111 is aligned with each of the $1^{st}$ and $3^{rd}$ source/drain regions 110 and 130 in the $1^{st}$ direction D1 as shown in FIGS. 1B and 1C.

The metal lines M11-M16 may be formed of a same material such as W, Co, Al, Ti, Ta, Mo, Ru, Cu, etc., and may have a same dimension such as a height in the $3^{rd}$ direction D3. The vias V1-V6 may also be formed of the same material such as W, Co, Al, Cu, etc., and may have a same dimension such as a height in the $3^{rd}$ direction D3.

Based on the above-described structure, the 3DSFET device 10 may be implemented as a device-under-test (DUT) for measuring contact resistances in the 3DSFET device 10 under a Kelvin measurement method. Accurate measurement of contact resistances in a 3DSFET device is required at a development stage for improving device performance and integration density of the 3DSFET device.

Referring to FIG. 1A, the $1^{st}$ to $6^{th}$ source/drain regions 110-160 have contact resistances R1-R6, which may be generated by the $1^{st}$ to $6^{th}$ contact plugs 111-116 along with the $1^{st}$ to $6^{th}$ vias V1-V6, respectively, in view of FIGS. 1B and 1C. As described earlier, the contact plugs 111-116 may be formed of the same material and have an equal height in the $3^{rd}$ direction D3, and the vias V1-V6 may also be formed of a same material and have an equal height. Thus, the contact resistances R1-R6, may have the same resistance value, and further, they may be each a vertical contact resistance. For example, the contact resistance R2 of the $2^{nd}$ source/drain region 120 may be a vertical contact resistance along the $2^{nd}$ contact plug 112 at the $1^{st}$ point 1P, the $2^{nd}$ via V2, and interfaces between the $2^{nd}$ contact plug 112 at the $1^{st}$ point 1P, the $2^{nd}$ via V2 and the $2^{nd}$ metal line M12 at a point CE, which are vertically aligned with each other. This contact resistance R2 may be equal to the contact resistance R3 of the $3^{rd}$ source/drain regions 130 which may be a vertical contact resistance along the $3^{rd}$ contact plug 113 at a $1^{st}$ point 1P, the $3^{rd}$ via V3, and interfaces between the $3^{rd}$ contact plug 113 at the $1^{st}$ point 1P, the $3^{rd}$ via V3 and a $1^{st}$ end 1E of the $3^{rd}$ metal line M13, which are vertically aligned with each other.

Referring to FIG. 1A, in order to measure the contact resistance R2 of the $2^{nd}$ source/drain region 120 under this configuration of the 3DSFET device 10, a $2^{nd}$ terminal T2 may be connected to a current source forcing a current Ia and a $1^{st}$ terminal T1 may be connected to a current measuring circuit to measure the current Ia forced from the $2^{nd}$ terminal T2. The current source and the current measuring circuit may be implemented by an ammeter, for example, not being limited thereto. Further, the $2^{nd}$ terminal T2 and a $3^{rd}$ terminal T3 may be connected to respective probes of a voltmeter to measure a voltage Va applied between the two terminals T2 and T3.

When the two transistors 11 and 12 are turned on under this configuration of the 3DSFET device 10, the current Ia may flow from the $2^{nd}$ terminal T2 to the $1^{st}$ terminal T1 through the $2^{nd}$ source/drain region 120 having the contact resistance R2 so that the current sensing circuit connected to the $1^{st}$ terminal T1 may measure the current Ia. At this time, the current Ia may not flow to the $3^{rd}$ terminal because the $2^{nd}$ terminal T2 and the $3^{rd}$ terminal T3 are connected to the voltmeter having a very high resistance value. Accordingly, a voltage Va developed by the contact resistance R2 may be measured, and thus, the contact resistance R2 may be calculated by following simple equation 1 using the measured voltage Va and current Ia.

$$Va/Ia = R2 \qquad (1)$$

Referring to FIGS. 1A-1C, the above-described measurement of the contact resistance R2 of the $2^{nd}$ source/drain region 120 may be implemented by connecting the $1^{st}$ end E1 of the $2^{nd}$ metal line M12 to the current source ($2^{nd}$ terminal T2) and connecting a $1^{st}$ end E1 of the $1^{st}$ metal line M11 to the current sensing circuit ($1^{st}$ terminal T1). Further, the $2^{nd}$ end E2 of the $2^{nd}$ metal line M12 and a $2^{nd}$ end E2 of the $3^{rd}$ metal line may be connected to respective probes of the voltmeter ($2^{nd}$ terminal T2 and $3^{rd}$ terminal T3). At this time, the point CE of the $2^{nd}$ metal line M12 between the $1^{st}$ end E1 and the $2^{nd}$ end E2 thereof may be connected to the $2^{nd}$ contact plug 112 at the $1^{st}$ point 1P through the $2^{nd}$ via V2. For example, the $1^{st}$ end E1 and the $2^{nd}$ end E2 of the $2^{nd}$ metal line M12 may be opposite to each other in the $1^{st}$ direction, not being limited thereto, with respect to the $2^{nd}$ contact plug 112 in a plan view. In addition, a $2^{nd}$ end E2 of the $1^{st}$ metal line M11 may be connected to the $1^{st}$ contact plug 111 through the $1^{st}$ via V1, and the $1^{st}$ end El of the $3^{rd}$ metal line M13 may be connected to the $3^{rd}$ contact plug 113 through the $3^{rd}$ via V3.

With the foregoing Kelvin measurement connection structure, the two transistors 11 and 12 may be turned on by applying respective gate input signals to the $1^{st}$ and $2^{nd}$ gate structures G1 and G2. When the two transistors 11 and 12 are turned on, the current sensing circuit connected to the $1^{st}$ metal line may measure the current la which is forced from the $2^{nd}$ metal line M12 to flow to the $1^{st}$ metal line M11 through the $2^{nd}$ via V2, the $2^{nd}$ contact plug 112, the $2^{nd}$ source/drain region 120, the $1^{st}$ source/drain region 110, the $1^{st}$ contact plug 111, and the $1^{st}$ via V1. Simultaneously, the voltmeter connected to the $2^{nd}$ metal line M12 and the $3^{rd}$ metal line M13 may measure the voltage Va applied thereto, which may be developed by the contact resistance R2 of the $2^{nd}$ source/drain region 120. Thus, the contact resistance R2 of the $2^{nd}$ source/drain region 120 can be calculated based on the measured voltage Va and current Ia as above.

However, it is noted that the contact resistance R2 calculated based on the measured voltage Va may be only a vertical contact resistance of the $2^{nd}$ source/drain region 120 existing in a vertical length along the $1^{st}$ point 1P of the $2^{nd}$ contact plug 112, the $2^{nd}$ via V2 and the point CE of the $2^{nd}$ metal line M12 in the $3^{rd}$ direction D3. That is, the contact resistance R2 may be a vertical contact resistance along the $2^{nd}$ contact plug 112 at the $1^{st}$ point 1P, the $2^{nd}$ via V2 and the interfaces between the $2^{nd}$ contact plug 112 at the $1^{st}$ point 1P, the $2^{nd}$ via V2 and the $2^{nd}$ metal line M12 at the point CE. Thus, the 3DSFET device 10 may be further configured to include a connection structure for measuring a lateral contact resistance RL of the $2^{nd}$ source/drain region 120 as described below.

Figure 2A:
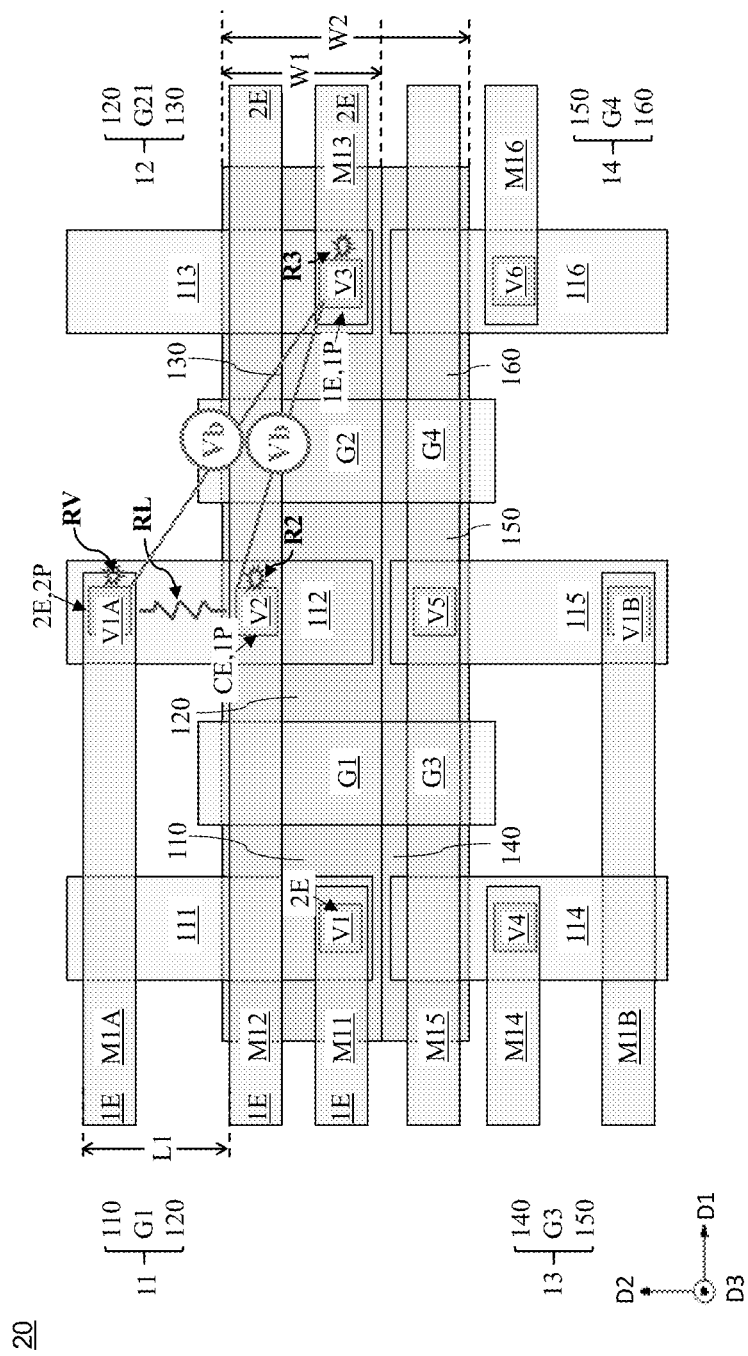
FIG. 2A illustrates a top plan view of a 3DSFET device configured to measure a lateral contact resistance of a source/drain region included therein, according to an embodiment.
Figure 2B:
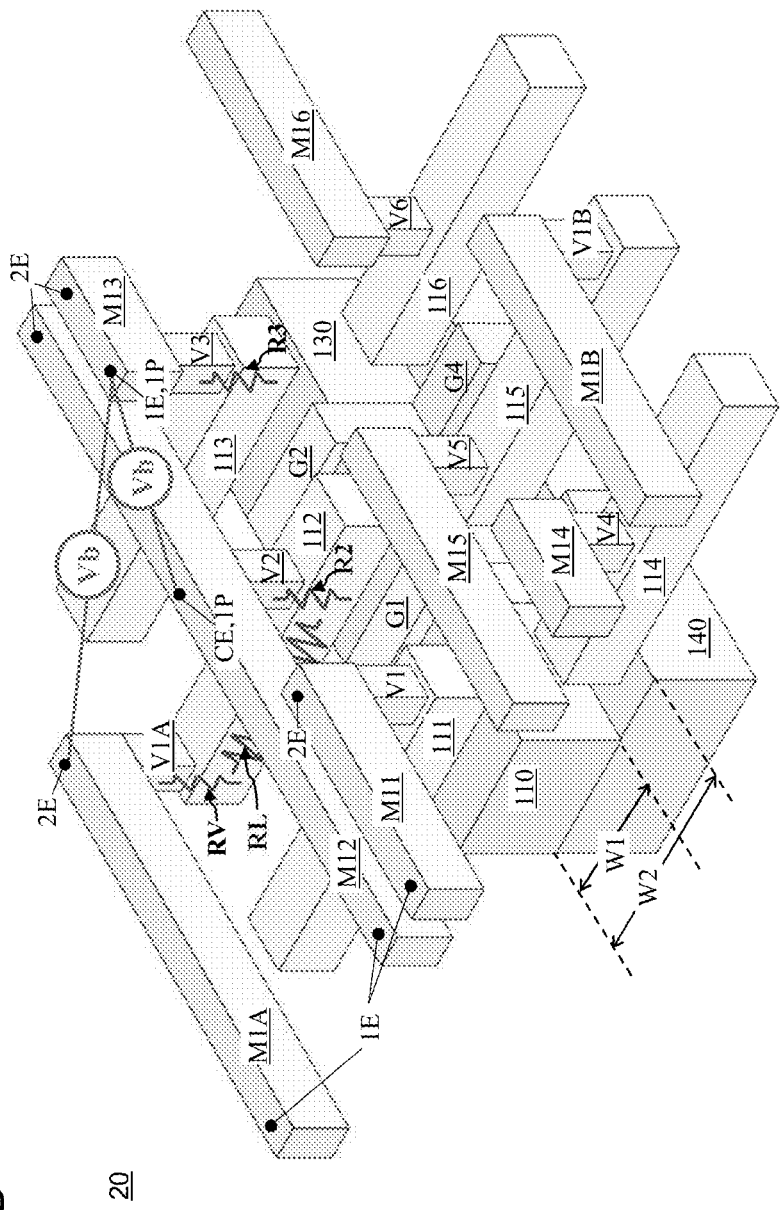
FIG. 2B illustrates a perspective view of the 3DSFET device of FIG. 2A, according to an embodiment.

FIG. 2A illustrates a top plan view of a 3DSFET device configured to measure a lateral contact resistance of a source/drain region included therein, according to an embodiment. FIG. 2B illustrates a perspective view of the 3DSFET device of FIG. 2A, according to an embodiment.

Referring to FIGS. 2A and 2B, a 3DSFET device 20 may include the same structural elements included in the 3DSFET device 10 of FIGS. 1B and 1C. However, the 3DSFET device 20 may further include an additional metal line. Thus, duplicate descriptions of the same structural elements included in each of the 3DSFET device 10 and the 3DSFET device 20 may be omitted herebelow while the same reference numerals for those structural elements are used.

In the 3DSFET device 20, a $1^{st}$ additional metal line M1A may be formed on the $2^{nd}$ contact plug 112 with a $1^{st}$ additional via V1A therebetween. For example, a $2^{nd}$ end 2E of the $1^{st}$ additional metal line M1A may be connected to a $2^{nd}$ point 2P of the $2^{nd}$ contact plug 112 which is opposite to the $1^{st}$ point 1P thereof in the $2^{nd}$ direction D1, and does not vertically overlap the $2^{nd}$ source/drain region 120. The $1^{st}$ additional metal line M1A may be formed at the same level as, in the same metal layer, and extended in the same $1^{st}$ direction D1 as the $1^{st}$ to $3^{rd}$ metal lines M11-M13.

The $1^{st}$ additional metal line M1A and $1^{st}$ additional via V1A may be spaced apart from the $2^{nd}$ metal layer M12 and $2^{nd}$ via V2 by a distance L1 in a $2^{nd}$ direction D2, which is a channel-width direction, on the $2^{nd}$ contact plug 112. The $1^{st}$ additional metal line M1A may not vertically overlap the $1^{st}$ to $3^{rd}$ source/drain regions 110-130 while the $1^{st}$ to $3^{rd}$ metal lines M11-M13 may vertically, at least partially, overlap the $1^{st}$ to $3^{rd}$ source/drain regions 110-130 in the $3^{rd}$ direction D3. The $1^{st}$ additional metal line M1A may be formed of the same material as the $1^{st}$ to $3^{rd}$ metal lines M11-M13. The $1^{st}$ additional via V1A may be formed of the same material as the $1^{st}$ to $3^{rd}$ vias V1-V3 and may have a same dimension (e.g., a height) as the $1^{st}$ to $3^{rd}$ vias V1-V3.

Under this additional connection structure in the 3DSFET device 20, a $1^{st}$ end 1E of the $1^{st}$ additional metal line MIA may be connected to a voltage source supplying a low voltage Vb, e.g., 50 mV, and the $1^{st}$ end 1E of the $1^{st}$ metal line M11 and the $2^{nd}$ end of the $3^{rd}$ metal line M13 may be grounded so that the two transistors 11 and 12 may operate in a linear mode when they are turned on. At this time, the current sensing circuit may be connected to at least one of the $1^{st}$ end 1E of the $1^{st}$ metal line M11 and the $2^{nd}$ end of the $3^{rd}$ metal line M13 to measure a linear current Ib flowing therethrough. Then, a contact resistance Rx existing in this current path may be calculated by following simple equation 2 based on the voltage Vb and the measured current Ib.

$$Rx = Vb/Ib \qquad (2)$$

Here, the contact resistance Rx may be a sum of: (i) a vertical contact resistance Rv along the $1^{st}$ additional via V1A, the $2^{nd}$ contact plug 112 at the $2^{nd}$ point 2P and interfaces between the $1^{st}$ additional via V1A, the $2^{nd}$ contact plug 112 at the $2^{nd}$ point 2P and the $1^{st}$ additional metal line M1A at the $2^{nd}$ end 2E, (ii) a lateral contact resistance RL along the distance L1 of the $2^{nd}$ contact plug 112, and (iii) a vertical contact resistance R3 along the $3^{rd}$ via V3, the $3^{rd}$ contact plug 113 at the $1^{st}$ point 1P and interfaces between the $3^{rd}$ contact plug 113 at the $1^{st}$ point 1P, the $3^{rd}$ via V3 and the $3^{rd}$ metal line M13 at the $1^{st}$ end 1E.

Thus, the contact resistance Rx may be calculated by following simple equation (3):

$$Rx = Rv + RL + R3 \qquad (3)$$

Here, as described earlier, the $2^{nd}$ contact plug 112 and the $1^{st}$ additional via V1A causing the vertical contact resistances Rv at the $2^{nd}$ point 2P and the $3^{rd}$ contact plug 113 at the $1^{st}$ end 1E and the $3^{rd}$ via V3 causing the vertical contact resistance R3 may be formed of the same material and have an equal height, respectively. Thus, these two vertical contact resistance Rv and R3 may be equal to each other. Then, the contact resistance Rx may be recalculated by following simple equation 4:

$$Rx = 2 \times R3 + RL \qquad (4)$$

Subsequently or before the above measurement of the linear current Ib to calculate the contact resistance Rx, one of the $1^{st}$ end 1E and the $2^{nd}$ end 2E of the $2^{nd}$ metal line M12 may be connected to the voltage source supplying the same amount of voltage Vb used in the above operation, and $1^{st}$ end 1E of the $1^{st}$ metal line M11 and the $2^{nd}$ end of the $3^{rd}$ metal line M13 may be grounded so that the two transistors 11 and 12 may operate in a linear mode again when they are turned on. At this time, the current sensing circuit may be connected to at least one of the $1^{st}$ end 1E of the $1^{st}$ metal line M11 and the $2^{nd}$ end of the $3^{rd}$ metal line M13 to measure a linear current Ic flowing therethrough. Then, a contact resistance Ry existing in this current path may be calculated by following simple equation 5 based on the voltage Vb and the measured current Ic.

$$Ry = Vb/Ic \qquad (5)$$

Here, the contact resistance Ry may be a sum of: (i) the vertical contact resistance R2 along the $2^{nd}$ contact plug 112 at the $1^{st}$ point 1P, the $2^{nd}$ via V2 and the interfaces between the $2^{nd}$ contact plug 112 at the $1^{st}$ point 1P, the $2^{nd}$ via V2 and the $2^{nd}$ metal line M12 at the point CE, and (ii) a vertical contact resistance R3 along the $3^{rd}$ contact plug 113 at the $1^{st}$ point 1P, the $3^{rd}$ via V3, and interfaces between the $3^{rd}$ contact plug 113 at the $1^{st}$ point 1P, the $3^{rd}$ via V3 and the $1^{st}$ end 1E of the $3^{rd}$ metal line M13. Thus, the contact resistance Ry may be calculated by following simple equation 6:

$$Ry = R2 + R3 \qquad (6)$$

However, as the voltage source is connected to the $2^{nd}$ metal line M12 instead of the $1^{st}$ additional metal line M1A to measure the contact resistance Ry, the lateral contact resistance RL may not be included in the contact resistance Ry.

Further, as described earlier, the $2^{nd}$ contact plug 112 at the $1^{st}$ point 1P and the $2^{nd}$ via V2 causing the vertical contact resistance R2 and the $3^{rd}$ contact plug 113 at the $1^{st}$ point 1P and the $3^{rd}$ via V3 causing the vertical contact resistance R3 may be formed of the same material and have an equal height, respectively. Thus, these two vertical contact resistances R2 and R3 may be equal to each other. Then, the contact resistance Ry may be recalculated by following simple equation 7:

$$Ry = 2 \times R3 \tag{7}$$

Thus, the later contact resistance RL of the $2^{nd}$ source/drain region 120 may be obtained by following simple equation 8.

$$RL = Rx( = 2 \times R3 + RL) - Ry( = 2 \times R3) \tag{8}$$

The same or substantially similar connection structures including a $2^{nd}$ additional metal line M1B and a $2^{nd}$ additional via V1B may be formed on the $4^{th}$ to $6^{th}$ contact plugs 114-116 to measure vertical contact resistances and a lateral contact resistance of the $5^{th}$ source/drain region 150 shared by the $3^{rd}$ field-effect transistor 13 and the $4^{th}$ field-effect transistor 14 at the $2^{nd}$ stack of the 3DSFET device 10 based on the same operation described above. Thus, duplicate descriptions are omitted herein.

As described above, the 3DSFET device 20 according to present embodiments may implement a macro device-under-test (DUT) structure which is able to measure not only a vertical contact resistance but also a lateral contact resistance of a source/drain region at both at a lower stack and an upper stack of a 3DSFET device.

In the above embodiments of measuring the lateral contact resistance RL of the $2^{nd}$ contact plug 112 of the 3DSFET device 20, the 3DSFET device 20 is configured to include the $1^{st}$ to $3^{rd}$ metal lines M11-M13, the $1^{st}$ to $3^{rd}$ vias V1-V3, the $1^{st}$ additional metal line M1A and the $1^{st}$ additional via V1A at least to facilitate connections of these structural elements to current source, the current sensing circuit and the voltmeter thereto. Further, although not described above and shown in the drawings, respective connection pads may be formed on the 1st ends 1E, the $2^{nd}$ ends 2E and points CE of these metal lines.

However, the disclosure is not limited thereto, and at least the $1^{st}$ and $3^{rd}$ metal lines M11 and M13, the $1^{st}$ and $3^{rd}$ vias V1 and V3, and the $1^{st}$ and $3^{rd}$ contact plugs 111 and 113 may be omitted in the 3DSFET device 20 as a DUT structure to measure the lateral contact resistance RL of the $2^{nd}$ contact plug 112 on the $2^{nd}$ source/drain region 120, according to an embodiment. For example, instead of the respective connections to the $1^{st}$ end 1E and the $2^{nd}$ end 2E, respective direct connections to the $1^{st}$ source/drain region 110 and the $3^{rd}$ source/drain region may be used to measure the current and the voltage based on which the lateral resistance RL of the $2^{nd}$ contact plug 112 on the $2^{nd}$ source/drain region 120 can be obtained.

In the meantime, there also exists a backside contact resistance when a BSPDN structure is added to a 3DSFET device. For example, a backside contact resistance may exist in a backside via which connects a contact plug on a source/drain region of 3DSFET device to a voltage source or other circuit elements. Thus, it is also required to accurately measure the backside contact resistance of the backside via.

According to embodiments, the 3DSFET device 20 may be expanded by adding a BSPDN structure to measure a backside contact resistance of the $2^{nd}$ source/drain region 120.

Figure 3A:
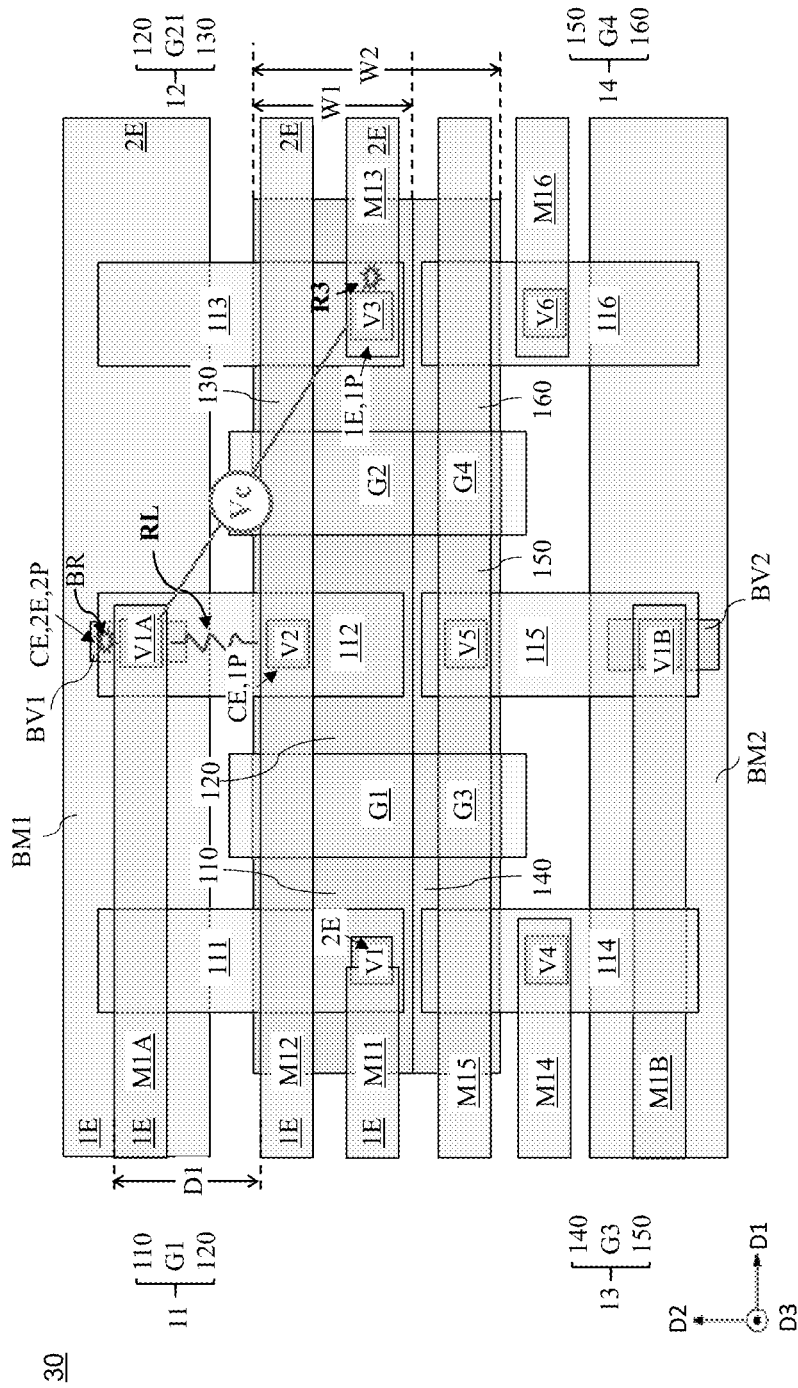
FIG. 3A illustrates a top plan view of a 3DSFET device configured to measure a contact resistance of a backside contact structure as well as a frontside contact structure included therein, according to an embodiment, FIG. 3B illustrate a perspective view of the 3DSFET device of FIG. 3A, according to an embodiment.
Figure 3B:
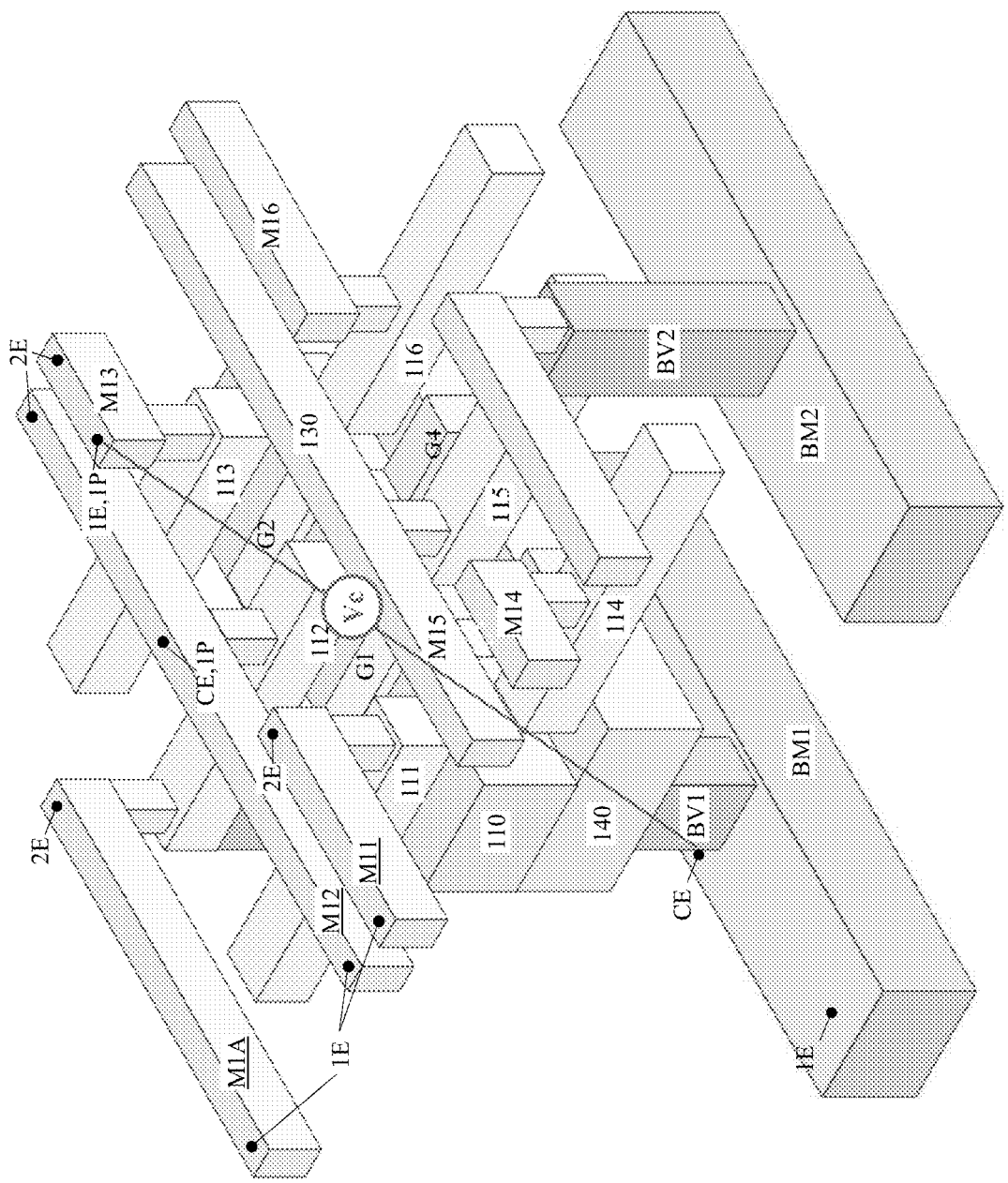
FIG. 3C illustrates a partial view of the 3DSFET device of FIG. 3B, according to an embodiment.
Figure 3C:
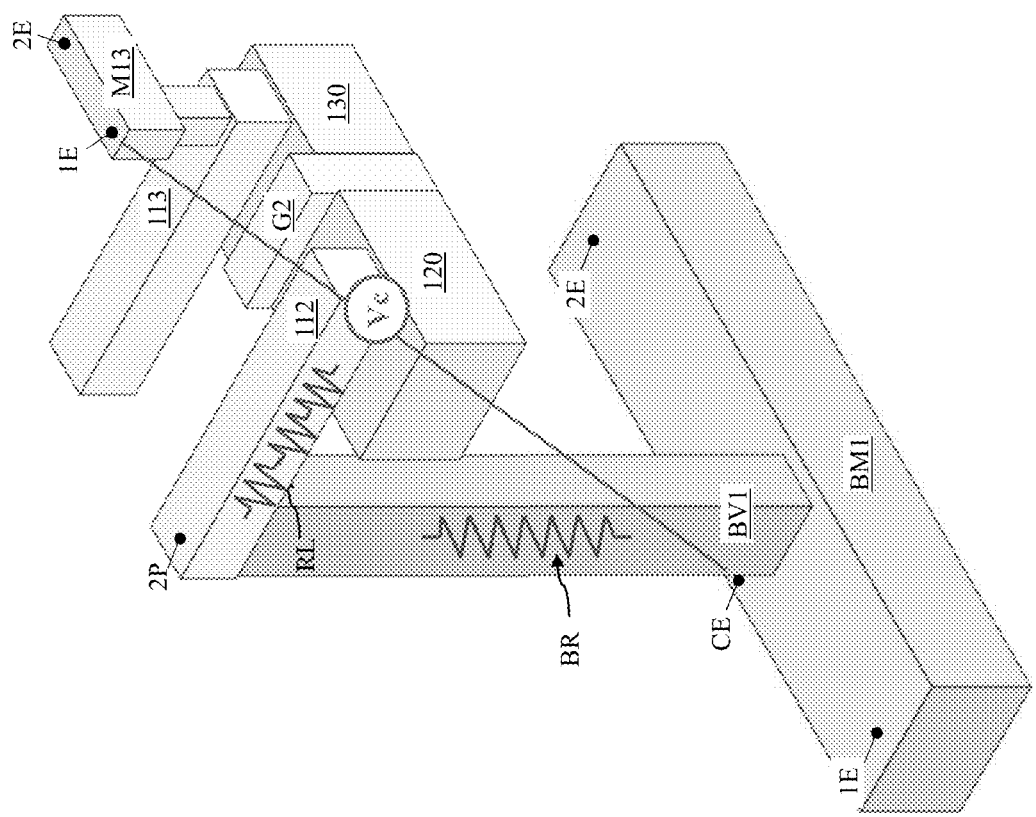

FIG. 3A illustrates a top plan view of a 3DSFET device configured to measure a contact resistance of a backside contact structure as well as a frontside contact structure included therein, according to an embodiment. FIG. 3B illustrate a perspective view of the 3DSFET device of FIG. 3A, according to an embodiment. FIG. 3C illustrates a partial view of the 3DSFET device of FIG. 3B, according to an embodiment.

Referring to FIGS. 3A and 3B, a 3DSFET device 30 may include the same structural elements included in the 3DSFET device 20 of FIGS. 2A and 2B. However, the 3DSFET device 30 may further include a BSPDN structure. Thus, duplicate descriptions of the same structural elements included in each of the 3DSFET device 20 and the 3DSFET device 30 may be omitted, while the same reference numerals for those structural elements are used.

The BSPDN structure formed in the 3DSFET device 20 may include a $1^{st}$ backside metal line BM1 and a $1^{st}$ backside via BV1 connected to each other for the $1^{st}$ and $2^{nd}$ field-effect transistors 11 and 12, and a $2^{nd}$ backside metal line BM2 and a $2^{nd}$ backside via BV2 connected to each other for the $3^{rd}$ and $4^{th}$ field-effect transistors 13 and 14.

The $1^{st}$ backside metal lines BM1 may be connected to the $2^{nd}$ contact plug 112 on the $2^{nd}$ source/drain region 120 through the $1^{st}$ backside via BV1. For this connection, the $1^{st}$ backside metal line BM1 may be formed at a back side of the 3DSFET device 20 to extend in the $1^{st}$ direction D1 similar to the $2^{nd}$ metal line M12 so that a $1^{st}$ end 1E and a $2^{nd}$ end 2E of the $1^{st}$ backside metal line BM1 are opposite to each other with respect to the $2^{nd}$ contact plug 112 in a plan view. Further, a bottom end of the $1^{st}$ backside via BV1 may be formed on a point CE of the $1^{st}$ backside metal line BM1 between the $1^{st}$ end 1E and the $2^{nd}$ end 2E in the $1^{st}$ direction D1, and vertically extended upward to a bottom surface of the $2^{nd}$ contact plug 112 at the $2^{nd}$ point 2P directly below or vertically aligned with the $2^{nd}$ end 2E of the $1^{st}$ additional metal line M1A.

Referring to FIG. 3C, which is a partial view of FIG. 3B showing the connection of the $1^{st}$ backside metal line BM1 and the $1^{st}$ backside via BV1 to the $2^{nd}$ contact plug 112, a backside contact resistance BR may exist in the $1^{st}$ backside via BV1 in the D3 direction, that is, a vertical direction. Thus, this backside contact resistance BR may be another vertical contact resistance of the $2^{nd}$ source/drain region 120.

In order to obtain the backside contact resistance BR of the $2^{nd}$ source/drain region 120, the $1^{st}$ end 1E of the $1^{st}$ backside metal line BM1 may be connected to the current source to force a current Ic to flow to the $1^{st}$ end 1E of the $1^{st}$ metal line M11, to which the current sensing circuit is connected to as in the previous embodiment. At the same time, one probe of the voltmeter may be connected to the $2^{nd}$ end 2E of the $1^{st}$ backside metal line BM1 and the other probe of the voltmeter may be connected to the $2^{nd}$ end 2E of the $3^{rd}$ metal line M13 to measure a voltage Vc applied thereto. Thus, another Kelvin measurement connection structure is formed in the 3DSFET device 30 by the $1^{st}$ backside metal line BMI and the $1^{st}$ backside via V1 instead of the $2^{nd}$ metal line M12 and the $2^{nd}$ via V2.

When the two transistors 11 and 12 are turned on, the current Ic may flow from the $1^{st}$ backside metal line BM1 (connected to the current source) to the $1^{st}$ end 1E of the $1^{st}$ metal line M11 through the $1^{st}$ backside via BV1, the $2^{nd}$ contact plug 112, the $2^{nd}$ source/drain region 120, the $1^{st}$ source/drain region and the $1^{st}$ via V1, and the voltage Vc may be measured by the voltmeter which is applied between the $2^{nd}$ end 2E of the $1^{st}$ backside metal line BM1 and the $2^{nd}$ end 2E of the $3^{rd}$ metal line M13. The voltage Vc at this time may be developed by the backside contact resistance BR in addition to the lateral contact resistance RL that is previously obtained.

Thus, the backside contact resistance BR of the $2^{nd}$ source/drain region 120 can be calculated based on the measured voltage Vc and current Ic and the previously-obtained lateral contact resistances RL according to following simple equations 9 and 10.

$$Vc/Ic = BR + RL \quad (9)$$
$$BR = Vc/I - RL \quad (10)$$

In a similar manner, a backside contact resistance of the $5^{th}$ source/drain region 150 which may be a vertical contact resistance of the $2^{nd}$ backside via BV2 connected to the $2^{nd}$ backside metal line BM2 may also be obtained.

In the above embodiments described in reference to FIGS. 2A-2C, the backside contact resistance BR is obtained after the lateral contact resistance RL is obtained in advance as described in reference to FIGS. 1A-1C. However, in the following embodiment, the lateral contact resistance RL may be obtained in a different manner.

Figure 4:
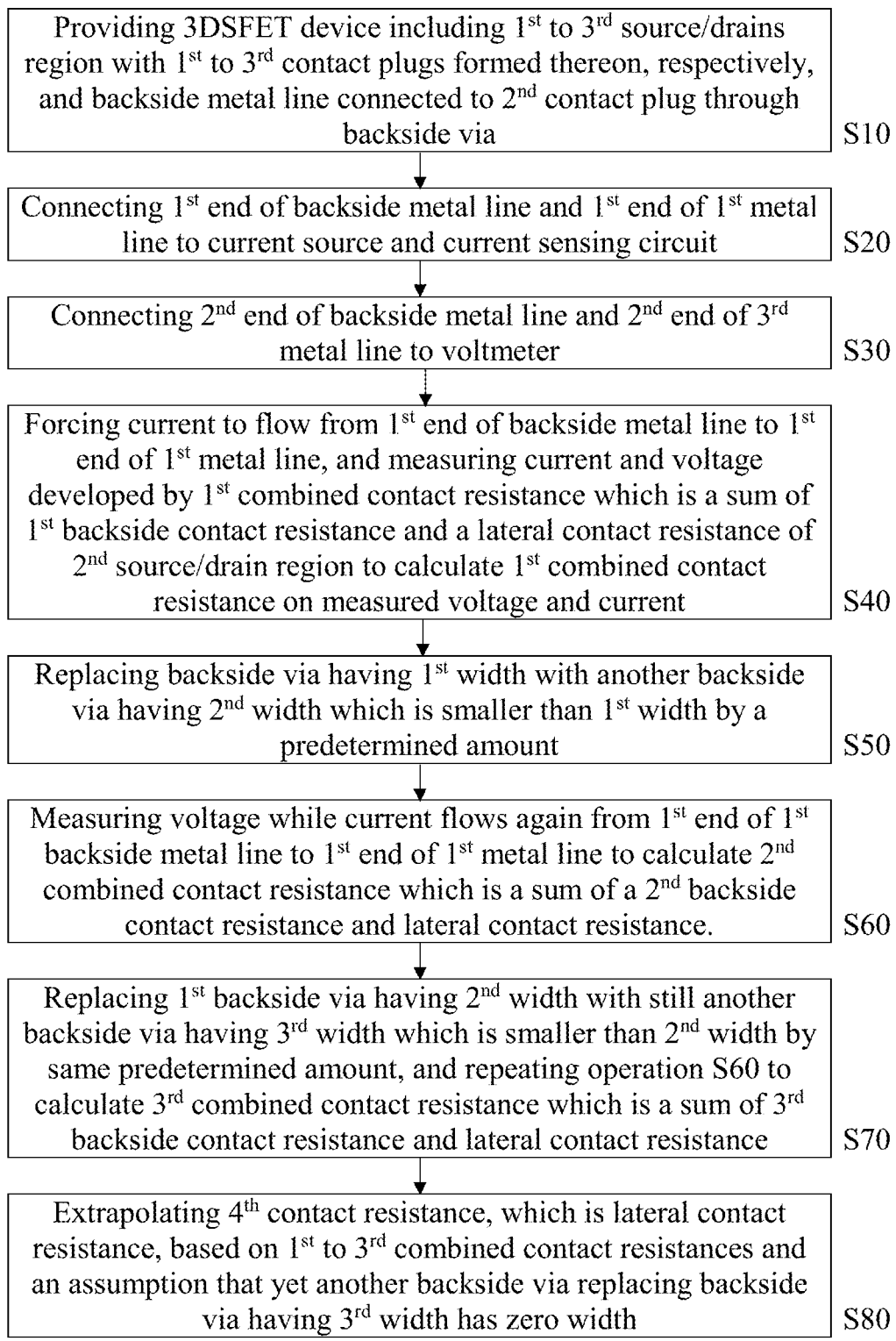
FIG. 4 illustrates a flowchart for a method of obtaining a contact resistance of a semiconductor device including a BSPDN structure, according to an embodiment. This method is described in reference to FIGS. 2A-2C, 3A and 3B.

FIG. 4 illustrates a flowchart for a method of obtaining a contact resistance of a semiconductor device including a BSPDN structure, according to an embodiment. This method is described in reference to FIGS. 2A-2C, 3A and 3B.

In operation S10, the 3DSFET device 30 including the $1^{st}$ to $3^{rd}$ source/drains region 110-130 may be provided. The $1^{st}$ to $3^{rd}$ source/drain regions 110-130 may have the $1^{st}$ to $3^{rd}$ contact plugs 111-113 formed thereon, respectively.

The $1^{st}$ and $3^{rd}$ metal lines M11 and M13 may be formed on the $1^{st}$ and $3^{rd}$ contact plugs 111 and 113 with the $1^{st}$ and $3^{rd}$ vias V1 and V3 therebetween, respectively. Further, the $1^{st}$ backside metal line BM1 may be connected to the $2^{nd}$ contact plug 112 though the $1^{st}$ backside via BV1 therebetween. The $1^{st}$ backside metal line BM1 may also be extended in the $1^{st}$ direction D1 with its $1^{st}$ end 1E and $2^{nd}$ end 2E opposite to each other with respect to the $2^{nd}$ contact plug 112 in a plan view.

The $1^{st}$ backside via BV1 may have a $1^{st}$ width P1 in the $1^{st}$ direction DI or the $2^{nd}$ direction D2.

In operation S20, the $1^{st}$ end 1E of the $1^{st}$ backside metal line BM1 may be connected to a current source to force the current Ic to flow to the $1^{st}$ end 1E of the $1^{st}$ metal line M11 through the $1^{st}$ backside via BV1, the $2^{nd}$ contact plug 112, the $2^{nd}$ source/drain region 120, the $1^{st}$ source/drain region 110 and the $1^{st}$ via V1. Further, the $1^{st}$ end 1E of the $1^{st}$ metal line M11 may be connected to the current sensing circuit to measure the current I.

In operation S30, the $2^{nd}$ end 2E of the $1^{st}$ backside metal line BM1 and the $2^{nd}$ end 2E of the $3^{rd}$ metal line M13 may be connected to the probes of the voltmeter to measure the voltage Vc developed by a $1^{st}$ combined contact resistance CR1 which is a sum of a $1^{st}$ backside contact resistance BR1 and the lateral contact resistance RL. Here, the $1^{st}$ backside contact resistance BR1 may be a vertical contact resistance of the $1^{st}$ backside via BV1 having the $1^{st}$ width P1.

In operation S40, the current Ic may be forced to flow from the $1^{st}$ end of the $1^{st}$ backside metal line BM1 to the $1^{st}$ end of the $1^{st}$ metal line M11, and the current Ic and the voltage Vc may be measured by the current sensing circuit and the voltmeter, respectively, at the same time to calculate the $1^{st}$ combined contact resistance CR1 based on the measured voltage Vc and current Ic.

In operation S50, the $1^{st}$ backside via BV1 having the $1^{st}$ width P1 may be replaced with another $1^{st}$ backside via BV1 having a $2^{nd}$ width P2 which is smaller than the $1^{st}$ width P1 by a predetermined amount.

In operation S60, the voltage Vc may be measured while the current Ic is forced to flow again from the $1^{st}$ end 1E of the $1^{st}$ backside metal line BM1 to the $1^{st}$ end 1E of the $1^{st}$ metal line M11 to calculate a $2^{nd}$ combined contact resistance CR2 which is a sum of a $2^{nd}$ backside contact resistance BR2 and the lateral contact resistance RL. Here, the $2^{nd}$ backside contact resistance BR2 may be a vertical contact resistance of the $1^{st}$ backside via BV1 having the $2^{nd}$ width P2.

In operation S70, the $1^{st}$ backside via BV1 having the $2^{nd}$ width P2 may be replaced with still another $1^{st}$ backside via BV1 having a $3^{rd}$ width P3 which is smaller than the $2^{nd}$ width P2 by the same predetermined amount, and repeat operation S60 to calculate a $3^{rd}$ combined contact resistance CR3 which is a sum of a $3^{rd}$ backside contact resistance BR3 and the lateral contact resistance RL. Here, the $3^{rd}$ backside contact resistance BR3 may be a vertical contact resistance of the $1^{st}$ backside via BV1 having the $3^{rd}$ width P3.

In operation S80, a $4^{th}$ contact resistance CR4 is extrapolated based on the $1^{st}$ to $3^{rd}$ combined contact resistances CR1, CR2 and CR3 and an assumption that yet another $1^{st}$ backside via BV1 replacing the $1^{st}$ backside via BV1 having the $3^{rd}$ width P3 has a zero width, that is, no contact resistance. Thus, the $4^{th}$ contact resistance CR4 may be only the lateral contact resistance RL.

In this manner, the lateral contact resistance RL may be separated out from measuring the $1^{st}$ to $3^{rd}$ combined contact resistance CR1, CR2 and CR3 and a simple extrapolation method.

In the above embodiment, the lateral contact resistance RL is extrapolated by varying the widths of the $1^{st}$ backside via BV1 only three times. However, the disclosure is not limited thereto, and the extrapolation may be performed by varying the width of the $1^{st}$ backside via BV1 by the predetermined amount only twice or more than three times, according to embodiments.

Further, while the lateral contact resistance RL is extrapolated in the above embodiment by gradually reducing the width of the $1^{st}$ backside via BV1 by the predetermined amount, the disclosure is not limited thereto, and the extrapolation may be performed by changing the width of the $1^{st}$ backside via BV1 in a different manner. For example, the width of the $1^{st}$ backside via BV1 may be increased by the predetermined amount, or increased and decreased by the predetermined amount for corresponding extrapolation.

The foregoing is illustrative of exemplary embodiments and is not to be construed as limiting the disclosure. Although a few exemplary embodiments have been described, those skilled in the art will readily appreciate that many modifications are possible in the above embodiments without materially departing from the disclosure.

What is claimed is:

1. A semiconductor device comprising:
a $1^{st}$ source/drain region comprising a first type of impurities;
a $2^{nd}$ source/drain region with a $2^{nd}$ contact plug thereon;
a $3^{rd}$ source/drain region;
a $2^{nd}$ metal line on the $2^{nd}$ contact plug with a $2^{nd}$ via therebetween;
a $1^{st}$ additional metal line on the $2^{nd}$ contact plug with a $1^{st}$ additional via therebetween; and
a $4^{th}$ source/drain region comprising a second type of impurities different from the first type,
wherein the $1^{st}$ source/drain region overlaps at least a part of the $4^{th}$ source/drain region in a vertical direction,
wherein the $2^{nd}$ source/drain region is disposed between and connected to the $1^{st}$ source/drain region and the $3^{rd}$ source/drain region, and
wherein the $2^{nd}$ metal line and the $1^{st}$ additional metal line are spaced apart from each other on the $2^{nd}$ contact plug by a $1^{st}$ predetermined distance in a $2^{nd}$ horizontal direction.

2. The semiconductor device of claim 1, wherein the $1^{st}$ additional metal line does not vertically overlap the $2^{nd}$ source/drain region.

3. The semiconductor device of claim 2, further comprising:
a $1^{st}$ contact plug on the $1^{st}$ source/drain region, a $1^{st}$ via on the $1^{st}$ contact plug, and a $1^{st}$ metal line on the $1^{st}$ via; and
a $3^{rd}$ contact plug on the $3^{rd}$ source/drain region, a $3^{rd}$ via on the $3^{rd}$ contact plug, and a $3^{rd}$ metal line on the $3^{rd}$ via.

4. The semiconductor device of claim 3, wherein the $1^{st}$ metal line and the $3^{rd}$ metal line overlap the $1^{st}$ source/drain region and the $3^{rd}$ source/drain region, respectively, at least partially in the vertical direction, and
wherein the $2^{nd}$ metal line overlaps the $2^{nd}$ source/drain region at least partially in the vertical direction.

5. The semiconductor device of claim 1, wherein the $2^{nd}$ metal line is extended in a $1^{st}$ horizontal direction, intersecting the $2^{nd}$ horizontal direction, to have a $1^{st}$ end and a $2^{nd}$ end opposite to each other with respect to the $2^{nd}$ contact plug.

6. The semiconductor device of claim 1, further comprising:
a $5^{th}$ source/drain region with a $5^{th}$ contact plug thereon;
a $6^{th}$ source/drain region;
a $5^{th}$ metal line on the $5^{th}$ contact plug with a $5^{th}$ via therebetween;
a $2^{nd}$ additional metal line on the $5^{th}$ contact plug with a $2^{nd}$ additional via therebetween,
wherein the $5^{th}$ source/drain region is disposed between and conneced to the $4^{th}$ source/drain region and the $6^{th}$ source/drain region, and
wherein the $5^{th}$ metal line and the $2^{nd}$ additional metal line are spaced apart from each other by a $2^{nd}$ predetermined distance in the $2^{nd}$ horizontal direction.

7. The semiconductor device of claim 6, wherein the $2^{nd}$ additional metal line does not vetically overlap the $5^{th}$ source/drain region.

8. The semiconductor device of claim 7, further comprising:
a 4th contact plug on the $4^{th}$ source/drain region, a $4^{th}$ via on the $4^{th}$ contact plug, and a $4^{th}$ metal line on the $4^{th}$ via; and
a $6^{th}$ contact plug on the $6^{th}$ source/drain region, a $6^{th}$ via on the $6^{th}$ contact plug, and a $6^{th}$ metal line on the $6^{th}$ via.

9. The semiconductor device of claim 8, wherein the $4^{th}$ metal line and the $6^{th}$ metal line overlap the $4^{th}$ source/drain region and the $^{th}$ source/drain region, respectively, at least partially in the vertical direction, and
wherein the $5^{th}$ metal line overlaps the $5^{th}$ source/drain region at least partially in the vertical direction.

10. The semiconductor device of claim 6, further comrpising at least one of a $1^{st}$ backside metal line connected to the $2^{nd}$ contact plug with a $1^{st}$ backside via therebetween, and a $2^{nd}$ backside metal line connected to the 5th contact plug with a 2nd backside via therebetween,
wherein the $1^{st}$ backside via is vertically aligned with the $1^{st}$ additonal via, and
wherein the $2^{nd}$ backside via is vertically aligned with the $2^{nd}$ additional via.

11. The semiconductor device of claim 1, further comprising a $1^{st}$ backside metal line connected to the $2^{nd}$ contact plug with a $1^{st}$ backside via therebetween,
wherein the $1^{st}$ backside via is vertically aligned with the $1^{st}$ additonal via.

* * * * *